United States Patent
Lee et al.

(10) Patent No.: US 8,159,885 B2
(45) Date of Patent: Apr. 17, 2012

(54) REFRESH CONTROL CIRCUIT AND SEMICONDUCTOR MEMORY DEVICE AND MEMORY SYSTEM INCLUDING THE SAME

(75) Inventors: Sang-Seok Lee, Suwon-si (KR); Hyun-Taek Jung, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 259 days.

(21) Appl. No.: 12/657,131

(22) Filed: Jan. 14, 2010

(65) Prior Publication Data

US 2010/0182851 A1 Jul. 22, 2010

(30) Foreign Application Priority Data

Jan. 19, 2009 (KR) .................. 10-2009-0004100

(51) Int. Cl.
*G11G 5/14* (2006.01)
(52) U.S. Cl. .................... 365/189.09; 365/222
(58) Field of Classification Search ............. 365/189.09, 365/222
See application file for complete search history.

(56) References Cited

U.S. PATENT DOCUMENTS

| | | |
|---|---|---|
| 6,327,210 B1 | 12/2001 | Kuroda et al. |
| 6,438,055 B1 | 8/2002 | Taguchi et al. |
| 6,885,603 B2 | 4/2005 | Lee |
| 2005/0041500 A1 | 2/2005 | Lee |
| 2005/0207214 A1 * | 9/2005 | Takahashi et al. ............ 365/154 |
| 2007/0091705 A1 * | 4/2007 | Hayashi ........................ 365/222 |
| 2007/0263471 A1 * | 11/2007 | Schoenfeld ................... 365/227 |
| 2008/0037344 A1 * | 2/2008 | Kobayashi .................... 365/203 |

FOREIGN PATENT DOCUMENTS

| | | |
|---|---|---|
| KR | 10-2001-0040049 A | 5/2001 |
| KR | 2001-0051718 A | 6/2001 |
| KR | 10-2004-0056124 A | 6/2004 |
| KR | 10-2006-0104904 A | 10/2006 |

* cited by examiner

*Primary Examiner* — Tuan T. Nguyen
(74) *Attorney, Agent, or Firm* — Onello & Mello, LLP.

(57) ABSTRACT

A semiconductor memory device includes a refresh control circuit and a memory cell array. The refresh control circuit generates an internal auto refresh control signal based on a chip select signal and an external self refresh control signal. The memory cell array is refreshed in response to the internal auto refresh control signal. Because the semiconductor memory device internally generates the internal auto refresh control signal performing auto refresh operations, the semiconductor memory device may not be required to transmit to external devices for performing the auto refresh operations, and thus pins or pads for transmitting signals may be reduced and operation time may become faster.

11 Claims, 6 Drawing Sheets

|  | CSB | WEB | S_REFB | CLK |
|---|---|---|---|---|
| READ | L | H | X | CLK ↑ |
| WRITE | L | L | X | CLK ↑ |
| AUTO REFRESH | H | X | H | CLK ↑ |
| SELF REFRESH | H | X | L | X |

X: DON'T CARE

200

REFRESH CONTROL CIRCUIT AND SEMICONDUCTOR MEMORY DEVICE AND MEMORY SYSTEM INCLUDING THE SAME

CROSS-REFERENCE TO RELATED APPLICATIONS

This application claims priority under 35 USC §119 to Korean Patent Application No. 2009-0004100, filed on Jan. 19, 2009 in the Korean Intellectual Property Office (KIPO), the entire contents of which are incorporated herein by reference.

BACKGROUND

1. Technical Field

Exemplary embodiments relate to a semiconductor memory device, and more particularly to a semiconductor memory device including a refresh control circuit and a memory system including the semiconductor memory device.

2. Description of the Related Art

Semiconductor memory devices may be classified into volatile memory devices and non-volatile memory devices according to whether stored information is retained when power to the semiconductor memory devices is off. Random access memory devices (RAM) are volatile memory devices which may be used as main memory devices for various devices such as personal computers. In dynamic RAM (DRAM), memory cells may include a transistor and a capacitor, and data "1" or "0" may be written by storing charge in the capacitor. Because the stored charge in the capacitor may decrease with time, the capacitors need to be periodically refreshed to maintain the data stored in them.

Memory cells in the DRAM are respectively connected to a corresponding word line and a corresponding bit line. In response to a word line enable signal, the transistors in the memory cells are turned on, and then stored charge is output to the bit line, or data provided through the bit line is stored in the capacitor.

Once charge is stored in the capacitor, the charge may be retained until a refresh period expires. After the refresh period expires, the written data may not be correctly identified since the stored charge decreases over time due to leakage current. The number of word lines (that is, rows) to be refreshed in the memory cell array may be referred to as a number of refresh cycles. A refresh interval may be obtained by dividing the refresh period by the number of refresh cycles.

Refresh operations performed in the DRAM may include auto refresh operations and self refresh operations. The auto refresh operations may be performed based on commands or control signals from the exterior of the semiconductor memory devices, and the self refresh operations may be performed based on oscillation signals generated by an internal oscillator included in semiconductor memory devices.

When the commands or control signals for performing the auto refresh operations are provided to the semiconductor memory devices through pins or pads, the configuration of a system including the semiconductor memory devices becomes complex, and access time to the semiconductor memory devices becomes great, thereby degrading overall performance of the system. Moreover, when the refresh operations are terminated before the refresh period expires, the semiconductor memory device unnecessarily performs the refresh operation again, and thus power consumption may be undesirably increased.

SUMMARY

Exemplary embodiments provide a refresh control circuit for internally generating an auto refresh control signal based on a self refresh control signal.

Exemplary embodiments provide a semiconductor memory device for terminating all refresh operations even if a refresh period is not expired to reduce power consumption.

Exemplary embodiments provide a memory system including a semiconductor memory device for compensating self refresh period according to an operational temperature.

According to one aspect, the inventive concept is directed to a semiconductor memory device which includes a refresh control circuit and a memory cell array. The refresh control circuit generates an internal refresh control signal based on a chip select signal and a logic state of an external self refresh control signal. The memory cell array is refreshed based on the internal refresh control signal.

The refresh control circuit may generate an internal auto refresh control signal when the chip select signal and the external self refresh control signal are disabled. Alternatively, the refresh control circuit may generate an internal self refresh control signal when the chip select signal is disabled and the external self refresh control signal is enabled.

In some exemplary embodiments, the refresh control circuit may include a first logical gate, an inverter, a second logical gate, a refresh oscillator, and a refresh counter. The first logical gate may perform a logical operation on the chip select signal and the external self refresh control signal to generate an internal auto refresh control signal. The inverter may invert the external self refresh control signal. The second logical gate may perform a logical operation on the chip select signal and an output signal of the inverter to generate an internal self refresh control signal. The refresh oscillator may generate an oscillation signal in response to the internal self refresh control signal. The refresh counter may generate the internal refresh control signal based on the internal auto refresh control signal and the oscillation signal, and may count a number of refresh cycles. Each refresh cycle may correspond to refresh operation of each row of a memory cell array.

In some exemplary embodiments, the refresh control circuit may include a first logical gate, a first inverter, a second logical gate, a temperature compensation circuit, a refresh oscillator, and a refresh counter. The first logical gate may perform a logical operation on the chip select signal and the external self refresh control signal to generate an internal auto refresh control signal. The first inverter may invert the external self refresh control signal. The second logical gate may perform a logical operation on the chip select signal and an output signal of the first inverter to generate an internal self refresh control signal. The temperature compensation circuit may generate a period control signal according to variations of the operational temperature. The refresh oscillator may generate an oscillation signal based on the internal self refresh control signal and the period control signal. The refresh counter may generate the internal refresh control signal based on the internal auto refresh control signal and the oscillation signal, and may count a number of refresh cycles. Each refresh cycle may correspond to refresh operation of a row of the memory cell array.

According to another aspect, the inventive concept is directed to a refresh control circuit which includes a first logical gate, a first inverter, a second logical gate, a refresh oscillator, and a refresh counter. The first logical gate performs a logical operation on a chip select signal and an external self refresh control signal to generate an internal auto refresh control signal. The first inverter inverts the external self refresh control signal. The second logical gate performs a logical operation on the chip select signal and an output signal of the first inverter to generate an internal self refresh control signal. The refresh oscillator generates an oscillation signal based on the internal self refresh control signal. The refresh counter generates the internal refresh control signal based on the internal auto refresh signal and the oscillation signal, and counts a number of refresh cycles each of which may correspond to refresh operation of a row of a memory cell array.

The refresh control circuit may further include a temperature compensation circuit which generates a period control signal varying according to the operational temperature. The period control signal may be provided to the refresh oscillator to control a period of the oscillation signal.

In some exemplary embodiments, the temperature compensation circuit may include a temperature sensor circuit, a comparison circuit, a second inverter, and a gating circuit. The temperature sensor circuit may sense the operational temperature of a semiconductor memory device. The comparison circuit may respectively compare a plurality of reference voltages and output signals of the temperature sensor circuit to generate comparison output signals. The second inverter may invert the external self refresh control signal. The gating circuit may perform logical operations on an output signal of the second inverter and the comparison output signals to generate the period control signals.

The temperature compensation circuit may further include a reference voltage generation circuit generating the plurality of reference voltages.

According to another aspect, the inventive concept is directed to a memory system which includes a memory controller and a semiconductor memory device. The memory controller generates a chip select signal and an external self refresh control signal. The semiconductor memory device generates an internal auto refresh control signal based on the chip select signal and a logic state of the external self refresh control signal, and refreshes a memory cell array based on the internal auto refresh control signal.

The refresh control circuit according to some embodiments generates the internal auto refresh control signal based on the external self refresh control signal and terminates the overall refresh operation when the refresh operation is completed with respect to all of the memory cell array to be refreshed even though a refresh period is not expired, and thus power consumption may be reduced. The power consumption may also be reduced by controlling the self refresh period according to the operational temperature. The semiconductor memory device including the refresh control circuit internally generates the auto refresh control signal, thus, the pins or pads for transmitting signals for executing the auto refresh operation from the exterior may not be required and the operation speeds may be improved.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

DESCRIPTION OF THE EMBODIMENTS

Figures 1, 2:
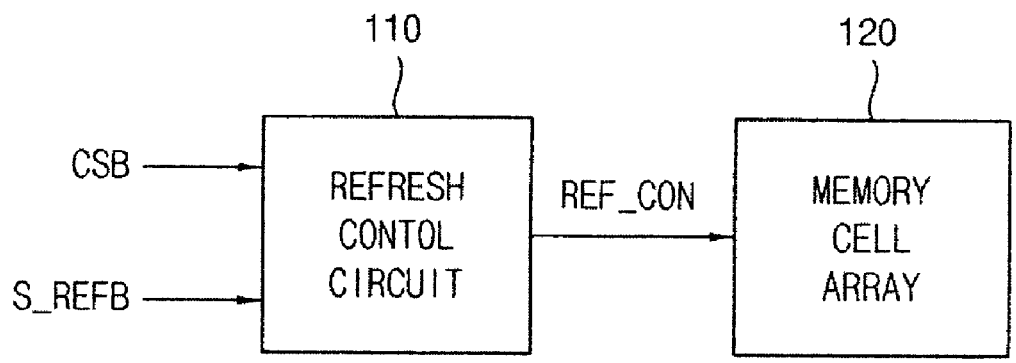
FIG. 1 is a block diagram illustrating a semiconductor memory device according to some exemplary embodiments.
FIG. 2 is a diagram illustrating operations of the semiconductor memory device of FIG. 1.

Embodiments of the inventive concept now will be described more fully with reference to the accompanying drawings, in which embodiments of the inventive concept are shown. The present inventive concept may, however, be embodied in many different forms and should not be construed as limited to the embodiments set forth herein. Rather, these embodiments are provided so that this description will be thorough and complete, and will fully convey the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a semiconductor memory device according to some exemplary embodiments.

Referring to FIG. 1, the semiconductor memory device 100 may include a refresh control circuit 110 and a memory cell array 120.

The refresh control circuit 110 generates an internal refresh control signal REF_CON based on a chip select signal CSB and an external self refresh control signal S_REFB. The memory cell array 120 is refreshed in response to the internal refresh control signal REF_CON.

The refresh control circuit 110 included in the semiconductor memory device 100 generates an auto refresh control signal without receiving the auto refresh control signal from an external device, and thus pads or input/output (I/O) pins for receiving the auto refresh signals from the exterior device are not required. The refresh control circuit 110 may vary a refresh period according to an operational temperature of the semiconductor memory device 100 based on temperature compensation functions. Also, the refresh control circuit 110 terminates a refresh mode by detecting a timing point when the refresh operations are completed with respect to all rows of the memory cell array 120. Each refresh cycle corresponds to refresh operation of each row of the memory cell array. Therefore, the semiconductor memory device 100 including the refresh control circuit 110 may reduce power consumption caused by fixed refresh periods.

FIG. 2 is a diagram illustrating operations of the semiconductor memory device of FIG. 1.

Referring to FIG. 2, the operations of the semiconductor memory device 100 may include a read operation, a write operation, an auto refresh operation, and a self refresh operation. Control signals including a chip select signal CSB, a write enable signal WEB, an external self refresh control signal S_REFB, and a clock signal CLK may be provided from the external device such as a memory controller.

The chip select signal CSB, the write enable signal WEB, and the external self refresh control signal S_REFB may be low active signals which are enabled to a logic state "low".

When the chip select signal CSB corresponds to the logic state "low" and the write enable signal WEB corresponds to a logic state "high", the read operation is performed synchronized with a rising edge of the clock signal CLK regardless of the external self refresh control signal S_REFB. When the chip select signal CSB corresponds to the logic state "low" and the write enable signal WEB corresponds to the logic state "low", the write operation is performed synchronized with the rising edge of the clock signal CLK regardless of the external self refresh control signal S_REFB. When the chip select signal CSB corresponds to the logic state "high" and the external self refresh control signal S_REFB corresponds to a logic state "high", the auto refresh operation is performed synchronized with the rising edge of the clock signal CLK regardless of the write enable signal WEB. When the chip select signal CSB corresponds to the logic state "high" and the external self refresh control signal S_REFB corresponds to the logic state "low", the self refresh operation is performed synchronized with an internally generated oscillation signal regardless of the write enable signal WEB and the clock signal CLK.

As represented in the non-limiting example of FIG. 2, the chip select signal CSB and the write enable signal WEB may be disabled to the logic state "high" in the auto refresh operation, whereas the chip select signal CSB may be disabled to the logic state "high" and external self refresh control signal S_REFB is enabled to the logic state "low" in the self refresh operation. Such logic states of the signals and corresponding configuration of the semiconductor memory device 100 may be varied in other embodiments.

Figure 3:
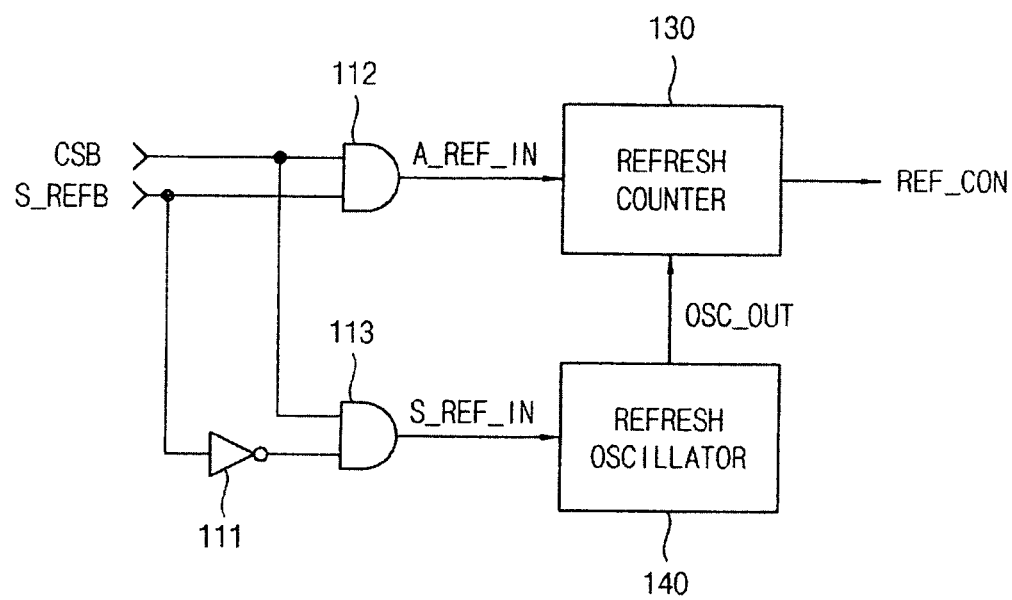
FIG. 3 is a circuit diagram illustrating an example of a refresh control circuit included in the semiconductor memory device of FIG. 1.

FIG. 3 is a circuit diagram illustrating an exemplary embodiment of the refresh control circuit included in the semiconductor memory device of FIG. 1.

Referring to FIG. 3, the refresh control circuit 110a may include a first inverter 111, a first logical gate 112, a second logical gate 113, a refresh counter 130, and a refresh oscillator 140.

The first logical gate 112 performs a logical operation on the chip select signal CSB and the external self refresh control signal S_REFB to generate an internal auto refresh control signal A_REF_IN. For example, the internal auto refresh control signal A_REF_IN is enabled to the logic state "high" when the chip select signal CSB and the external self refresh control signal S_REFB are disabled to the logic state "high". The first inverter 111 inverts the external self refresh control signal S_REFB, for example, a phase of the external self refresh control signal may be inverted. The second logical gate 113 performs a logical operation on the chip select signal CSB and an output signal of the first inverter 111 to generate an internal self refresh control signal S_REF_IN. In this case, the first and second logical gate may be AND logical gates. For example, the internal self refresh control signal S_REF_IN is enabled to the logic state "high" when the chip select signal CSB is disabled to the logic state "high" and the external self refresh control signal is enabled to the logic state "low". The refresh oscillator 140 generates an oscillation signal OSC_OUT in response to the internal self refresh control signal S_REF_IN. The refresh counter 130 generates an internal refresh control signal REF_CON based on the oscillation signal OSC_OUT and the internal auto refresh control signal A_REF_IN, and counts a number of refresh cycles for each row of the memory cell array. For example, the refresh counter 130 may include a refresh address counter and a row counter. The refresh address counter may generate respective row address to be refreshed synchronized with the clock signal CLK in the auto refresh operation or the oscillation signal OSC_OUT in the self refresh operation. The row counter counts the refresh cycles for each row, for example, the count number may be increased after respective refresh operation for each row is completed. The count number may correspond to the number of refresh cycles when the all of refresh operations are terminated, and may be initialized per the refresh period.

Hereinafter, operations of the refresh control circuit 110a of FIG. 3 will be described.

The refresh control circuit 110a performs the self refresh operation as follows.

The chip select signal CSB corresponds to the logic state "high" and the external self refresh control signal S_REFB corresponds to the logic state "low" during the self refresh operation. In self refresh operation, the internal auto refresh control signal A_REF_IN is disabled and the internal self refresh control signal S_REF_IN is enabled.

The refresh oscillator 140 generates the oscillation signal OSC_OUT having a predetermined period in response to the internal self refresh control signal S_REF_IN. The refresh counter 130 generates the internal refresh control signal REF_CON based on the oscillation signal OSC_OUT, and counts a number of the refresh cycles for each row of the memory cell array to detect the timing point for terminating the refresh mode.

The refresh control circuit 110a of FIG. 3 performs the auto refresh operation as follows.

The chip select signal CSB corresponds to the logic state "high" and the external self refresh control signal S_REFB corresponds to the logic state "high" during the auto refresh operation. In the auto refresh operation, the internal auto refresh control signal A_REF_IN is enabled, and the internal self refresh control signal S_REF_N is disabled.

Because the internal self refresh control signal S_REF_IN is disabled, the refresh oscillator 140 does not generate the oscillation signal OSC_OUT. The refresh counter 130 generates the internal refresh control signal REF_CON based on internal auto refresh control signal A_REF_IN synchronized with the clock signal CLK, and counts the number of the refresh cycles for each row of the memory cell array.

In the auto refresh operation, the refresh counter 130 counts the number of refresh cycles with sequentially increasing the count number one by one for each row, and terminates all of the refresh operations when the count number is greater than a number of rows of the memory cell array. Even if the refresh period is not expired, the refresh counter 130 disables the internal refresh control signal REF_CON to terminate the all of refresh operations when all rows of the memory cell array are refreshed. Thus, the refresh mode may be terminated even though the refresh period is not expired. The refresh counter 130 may be reset per refresh period.

Figure 4:
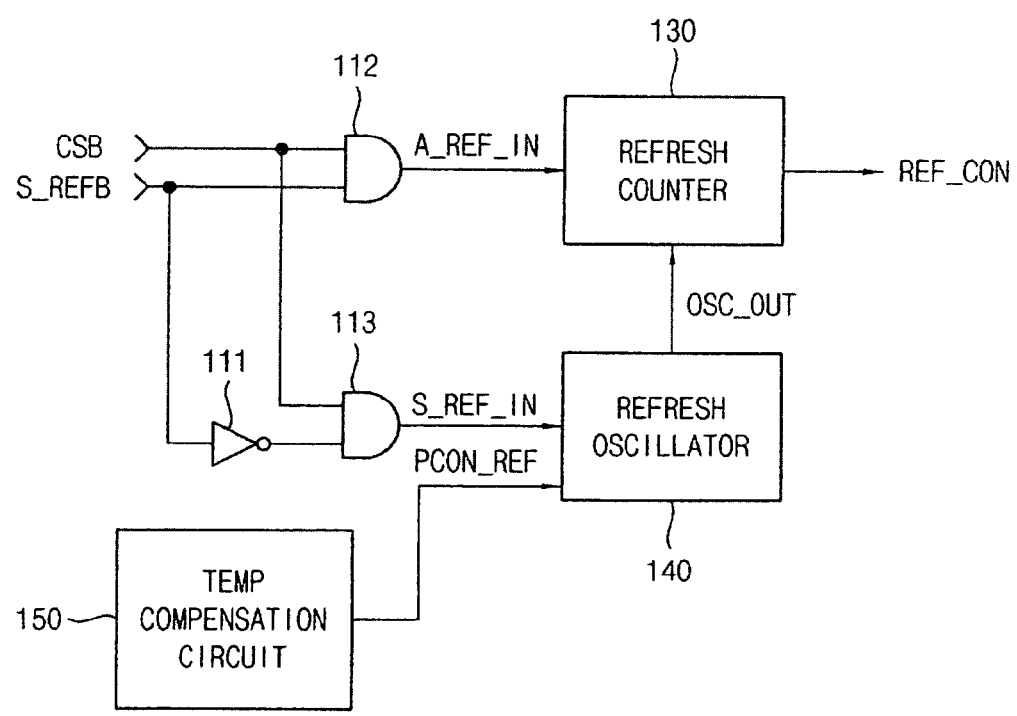
FIG. 4 is a circuit diagram illustrating another example of a refresh control circuit included in the semiconductor memory device of FIG. 1.

FIG. 4 is a circuit diagram illustrating another example of a refresh control circuit included in the semiconductor memory device of FIG. 1.

Referring to FIG. 4, the refresh control circuit 110b may include a first inverter 111, a first logical gate 112, a second logical gate 113, a refresh counter 130, a refresh oscillator 140, and a temperature compensation circuit 150.

The first logical gate 112 performs a logical operation on the chip select signal CSB and the external self refresh control signal S_REFB to generate an internal auto refresh control signal A_REF_IN. For example, the internal auto refresh control signal is enabled when both of the chip select signal CSB and the external self refresh control signal S_REFB are enabled to the logic state "high". The first inverter 111 inverts the external self refresh control signal S_REFB. The second logical gate 113 performs a logical operation on the chip select signal CSB and an output signal of the first inverter 111 to generate an internal self refresh control signal S_REF_IN. The temperature compensation circuit 150 generates a period control signal PCON_REF a voltage level of which varies according to the operational temperature. The refresh oscillator 140 generates an oscillation signal OSC_OUT based on the internal self refresh control signal S_REF_IN and the period control signal PCON_REF. The oscillation signal OST_OUT may have different periods according to the period control signal PCON_REF. The refresh counter 130 generates an internal refresh control signal REF_CON based on the oscillation signal OSC_OUT and the internal auto refresh control signal A_REF_IN, and counts a number of refresh cycles for each row of the memory cell array.

Figure 5:
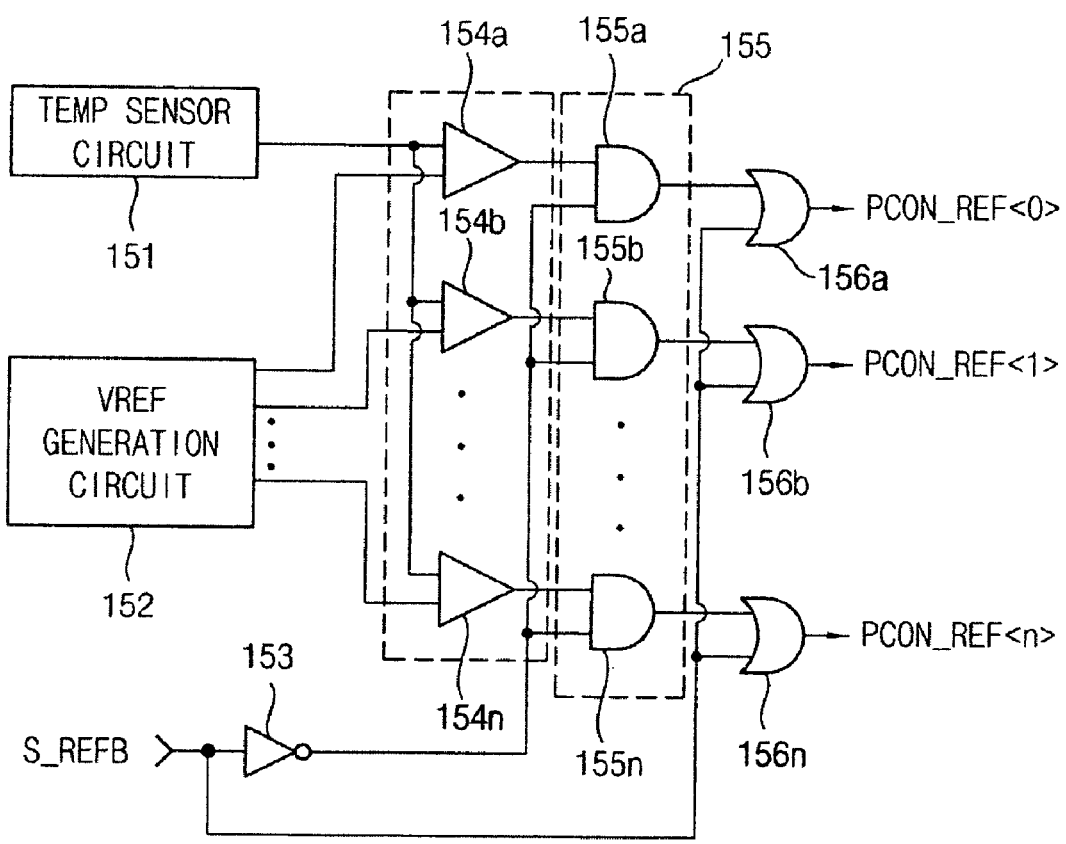
FIG. 5 is a circuit diagram illustrating an example of a temperature compensation circuit included in the refresh control circuit of FIG. 4.

FIG. 5 is a circuit diagram illustrating an example of the temperature compensation circuit included in the refresh control circuit of FIG. 4.

Referring to FIG. 5, the temperature compensation circuit 150 may include a temperature sensor circuit 151, a reference voltage generation circuit 152, a second inverter 153, a comparison circuit 154 including a plurality of comparators 154a, 154b, ..., 154n, and a gating circuit 155 including a plurality of logical gates 155a, 155b, ..., 155n.

The temperature sensor circuit 151 senses the operational temperature of the semiconductor memory device 100. The reference voltage generation circuit 152 generates a plurality of reference voltages having different voltage levels. The comparison circuit respectively compares the reference voltages and output signals of the temperature sensor circuit 151 to generate comparison output signals. The second inverter 153 inverts the external self refresh control signal S_REFB. The gating circuit 155 including logical gates 155a, 155b, ..., 155n respectively performs logical operations on output signals of the second inverter 153 and the comparison output signals to generate period control signals PCON_REF<0>, PCON_REF<1>, ..., PCON_REF<n>.

According to some exemplary embodiments, the temperature compensation circuit 150 may further include a plurality of logical gates 156a, 156b, ..., 156n, for example, logical OR gates. In this embodiment, the temperature compensation circuit 150 outputs period control signal PCON_REF regardless of the output signals of the gating circuit 155 during the auto refresh operation in which the external self refresh control signal S_REFB corresponds to the logic state "high". Thus, one of the period control signal PCON_REF may have a fixed value during the auto refresh operation and may be varied according to the operational temperature during the self refresh operation. When the logical gates 156a, 156b, ..., 156n are omitted, the output signals of the gating circuit 155 correspond to the period control signals PCON_REF<0>, PCON_REF<1>, ..., PCON_REF<n>.

Hereinafter, operations of the refresh control circuit of FIG. 4 will be described.

The self refresh operation may be performed as follows.

The chip select signal CSB corresponds to the logic state "high" and the external self refresh control signal S_REFB corresponds to the logic state "low" during the self refresh operation. In the self refresh operation, the internal auto refresh control signal A_REF_IN is disabled and the internal self refresh control signal S_REF_IN is enabled.

The refresh oscillator 140 generates the oscillation signal OSC_OUT having a predetermined period in response to the internal self refresh control signal S_REF_IN. The refresh counter 130 generates the internal refresh control signal REF_CON based on the oscillation signal OSC_OUT, and counts the number of the refresh cycles. Each refresh cycle may correspond to refresh operation of each row of the memory cell array. The period control signal PCON_REF is generated by the temperature compensation circuit 150, and varies according to the operational temperature of the semiconductor memory device 100. The period control signal PCON_REF may be a digital signal having a plurality of bits PCON_REF<0>, PCON_REF<1>, ..., PCON_REF<n>. The refresh oscillator 140 varies periods of the oscillation signal OSC_OUT based on the period control signal PCON_REF, and the internal refresh control signal REF_CON may be generated based on the oscillation signal OSC_OUT varied according to the operational temperature.

The auto refresh operation may be performed as follows.

The chip select signal CSB corresponds to the logic state "high" and the external self refresh control signal S_REFB corresponds to the logic state "high" during the auto refresh operation. In the auto refresh operation, the internal auto refresh control signal A_REF_IN is enabled, and the internal self refresh control signal S_REF_N is disabled.

Because the internal self refresh control signal S_REF_IN is disabled, the refresh oscillator 140 does not generate the oscillation signal OSC_OUT. The refresh counter 130 generates the internal refresh control signal REF_CON based on the internal auto refresh control signal A_REF_IN synchronized with the clock signal CLK, and counts the number of the refresh cycles.

In the auto refresh operation, the refresh counter 130 counts the refresh operations with sequentially increasing a count number one by one, and terminates the overall refresh operation when the count number is greater than the number of rows of the memory cell array. Even if the refresh period is not expired, the refresh counter 130 disables the internal refresh control signal REF_CON to terminate the overall refresh operation when all of rows of the memory cell array are refreshed.

Figure 6:
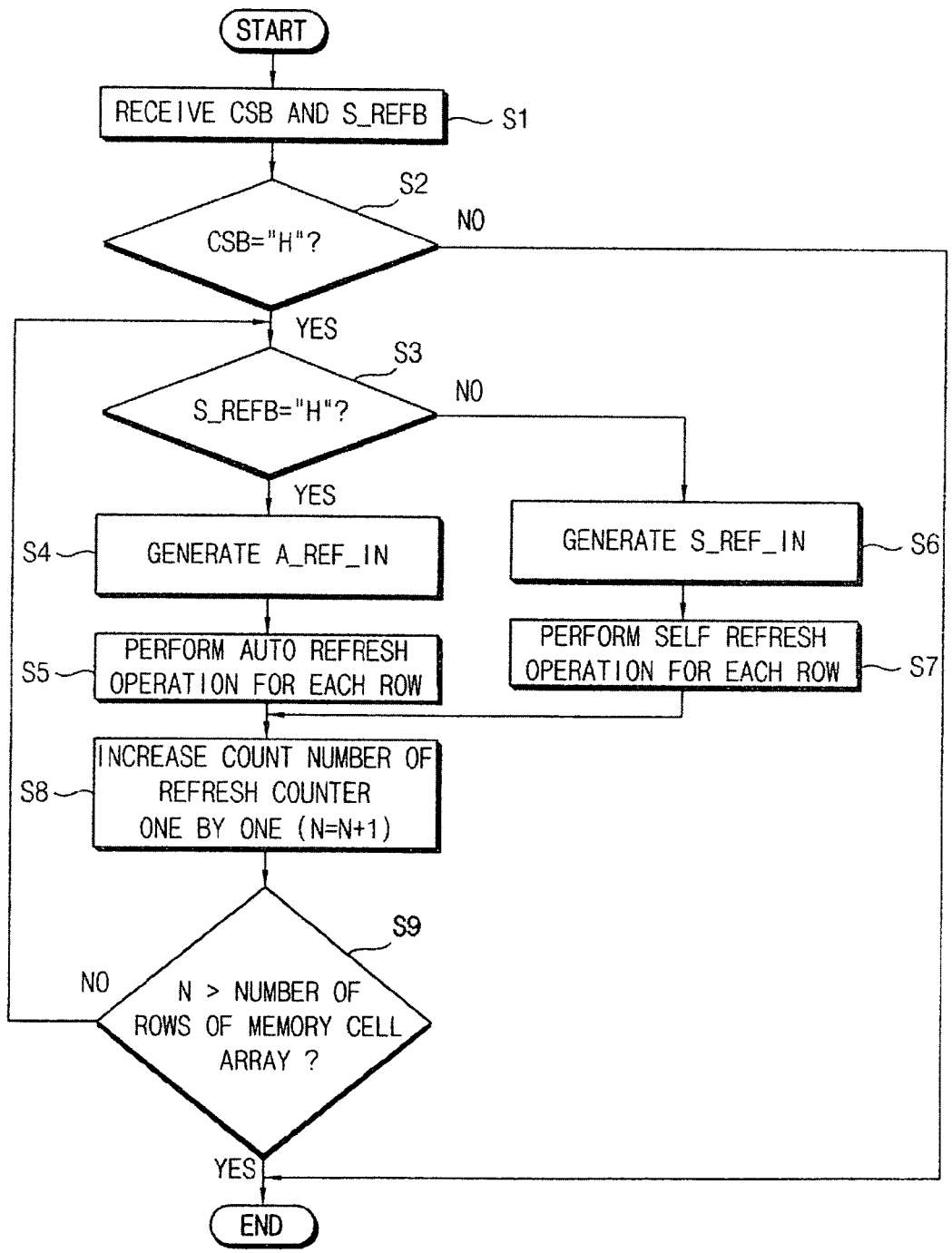
FIGS. 6 and 7 are flow charts illustrating methods of refreshing semiconductor memory devices according to some exemplary embodiments.
Figure 7:
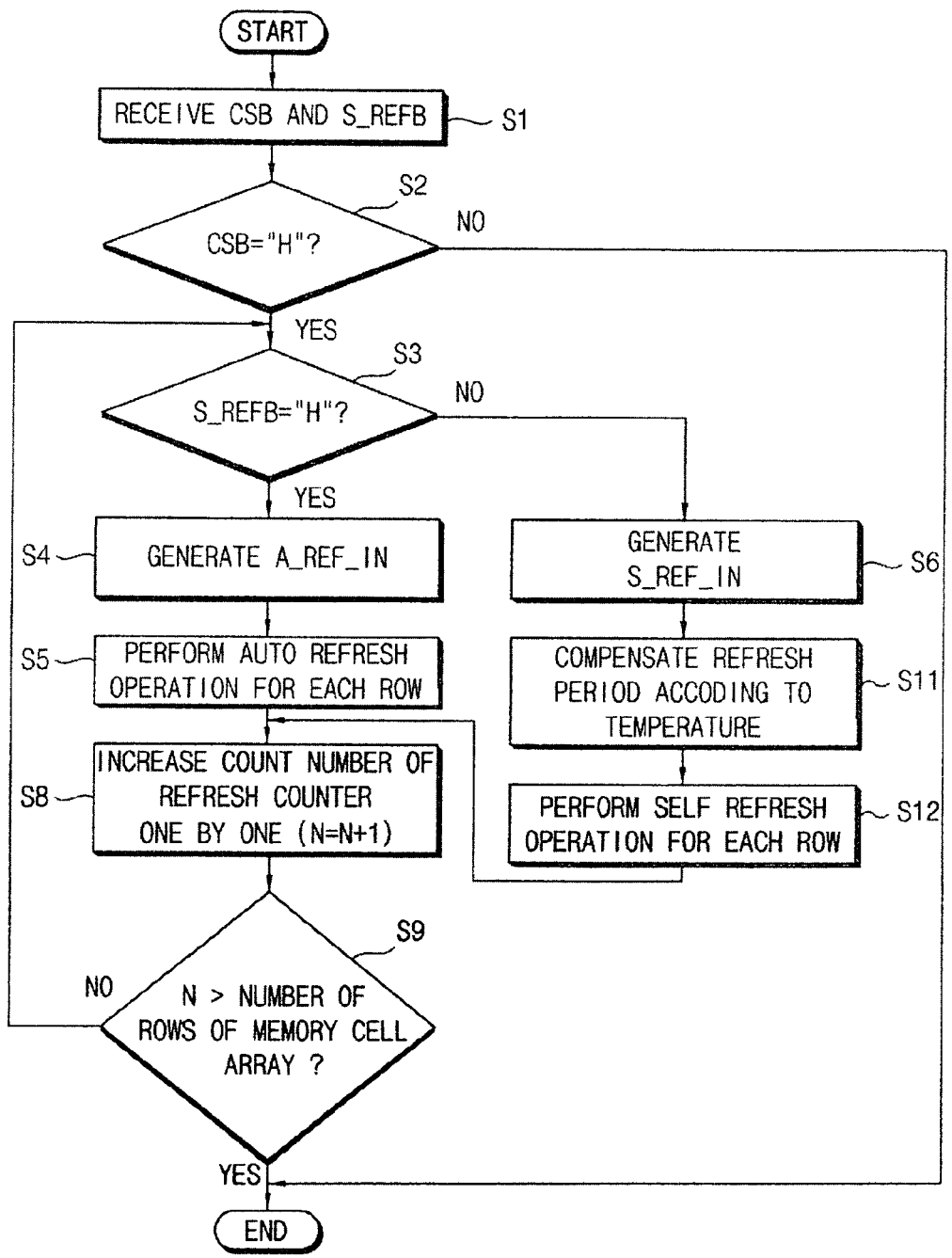

FIGS. 6 and 7 are flow charts illustrating methods of refreshing semiconductor memory devices according to some exemplary embodiments.

An example of the method will be described with reference to FIG. 6.

The chip select signal CSB and the external self refresh control signal S_REFB are received from the external device such as the memory controller (Step S1).

When the chip select signal CSB corresponds to the logic state "low" (Step S2: NO), all of refresh operation, that is the refresh mode, is terminated.

When the chip select signal CSB corresponds to the logic state "high" (Step S2: YES), it is determined whether the logic state of the external self refresh control signal S_REFB is "high" or "low" (Step S3).

When the external self refresh control signal S_REFB corresponds to the logic state "high", the internal auto refresh control signal is generated (Step S4), and the auto refresh operation is performed with respect to each row of the memory cell array synchronized with the clock signal CLK (Step S5). The count number of the refresh counter is increased one by one with respect to the auto refresh operation for each row (n=n+1) (Step S6).

When the external self refresh control signal S_REFB corresponds to the logic state "low", the internal self refresh control signal is generated (Step S6), and the self refresh operation is performed with respect to each row of the memory cell array synchronized with the oscillation signal OSC_OUT (Step S7). The count number of the refresh counter is increased one by one with respect to the self refresh operation for each row (n=n+1) (Step S8).

When the count number n is greater than the number of rows of the memory cell array (Step S9: YES), that is, the self refresh operation or the auto refresh operation is performed on every memory cell array, the refresh mode is terminated.

When the count number is equal to or smaller than the number of rows of the memory cell array (Step S9: NO), that is memory cells which are not refreshed remain, the refresh operation may be performed on another row of the memory cell array according to the above described method from Step S3.

Another example of the method will be described with reference to FIG. 7.

The chip select signal CSB and the external self refresh control signal S_REFB is received from the external devices by the refresh control circuit (Step S1).

When the chip select signal CSB corresponds to the logic state "low" (Step S2: NO), the refresh mode is terminated.

When the chip select signal CSB corresponds to the logic state "high" (Step S2: YES), it is determined whether the logic state of the self refresh control signal S_REFB is "high" or "low" (Step S3).

When the self refresh control signal S_REFB corresponds to the logic state "high", the internal auto refresh control signal is generated (Step S4). The auto refresh operation is performed on each row of the memory cell array (Step S5) and the count number of the refresh counter is increased one by one with respect to the auto refresh operation for the row (n=n+1) (Step S8).

When the self refresh control signal S_REFB corresponds to the logic state "low", the internal self refresh control signal is generated (Step S6). The refresh period is compensated according to the operational temperature of the semiconductor memory device (Step S11). The self refresh operation is performed on each row (Step S12) and count number of the refresh counter is increased one by one with respect to the self refresh operation for the row (n=n+1) (Step S8).

When the count number is greater than the number of rows of the memory cell array (Step S9: YES), the refresh mode is terminated.

When the count number is equal to or smaller than the number of rows of the memory cell array (Step S9: NO), the refresh operation is repeatedly performed on another row of the memory cell array through the method from Step S3.

Compared with the method illustrated in FIG. 6, the method of refreshing the semiconductor memory device illustrated in FIG. 7 performs a temperature compensation operation prior to the self refresh operation.

Figure 8:
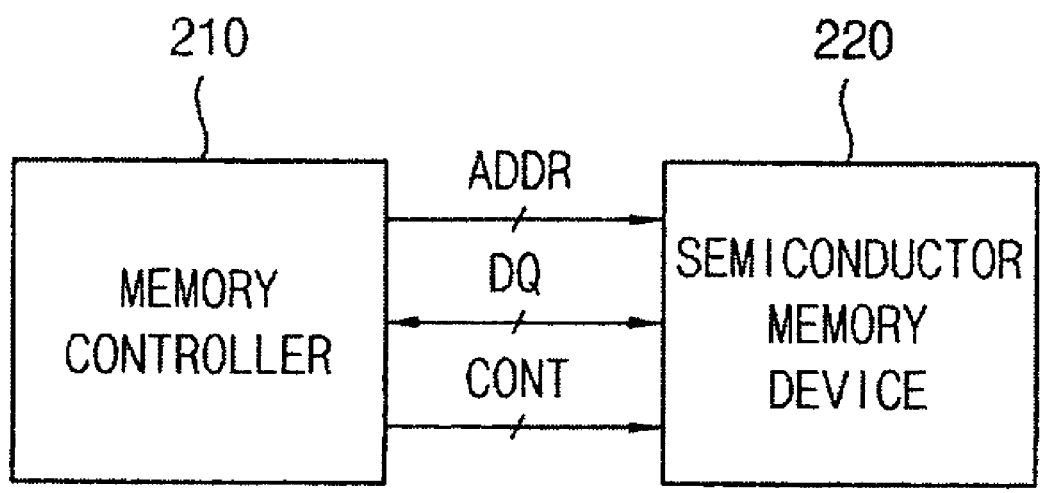
FIG. 8 is a block diagram illustrating a memory system including the semiconductor memory device according to some exemplary embodiments.

FIG. 8 is a block diagram illustrating a memory system including the semiconductor memory device according to some exemplary embodiments.

The memory system 200 may include a memory controller 210 and a semiconductor memory device 220.

The memory controller 210 generates address signals ADDR and control signals CONT, and provides them to the semiconductor memory device 220. Data DQ are transmitted between the memory controller 210 and the semiconductor memory device 220 through a bus. The control signals CONT may include the chip select signal CSB and the external self refresh control signal S_REFB.

The semiconductor memory device 220 may be implemented as illustrated in FIG. 1. The semiconductor memory device 220 generates the internal refresh control signal REF_CON based on the chip select signal CSB and the logic state of external self refresh control signal S_REFB, and refreshes the memory cell array based on the internal refresh control signal REF_CON. The self refresh operation and the auto refresh operation may be performed based on the internal refresh control signal REF_CON.

The semiconductor memory device 220 internally generates the internal refresh control signal REF_CON which controls both of the auto refresh operations and the self refresh operations, and terminates the refresh mode when the all of rows included in the memory cell array are refreshed although the refresh period is not expired. Therefore, the semiconductor memory device according to the inventive concept does not require the pads or I/O pins for receiving signals controlling the auto refresh operations, and thus, the semiconductor memory device may have simple structures. The semiconductor memory device according to the inventive concept varies the refresh periods according to the operational temperatures of the semiconductor memory devices such that the power consumption caused by performing undesired refresh operation based on fixed refresh periods may be reduced.

The semiconductor memory device and the memory system including the semiconductor memory device according to the inventive concept may be applicable to electronic memory devices requiring refresh operations and particularly to mobile memory devices having simple structures and consuming low power.

While the exemplary embodiments of the inventive concept and their advantages have been described in detail, it should be understood that various changes, substitutions and alternations may be made without departing from the scope of the inventive concept.

What is claimed is:

1. A semiconductor memory device, comprising:
    a refresh control circuit configured to generate an internal refresh control signal based on a chip select signal and an external self refresh control signal; and
    a memory cell array configured to be refreshed based on the internal refresh control signal,
    wherein the refresh control circuit is configured to generate an internal auto refresh control signal when the chip select signal and the external self refresh control signal are disabled.

2. The semiconductor memory device of claim 1, wherein the refresh control circuit comprises:
    a first logical gate configured to performs a logical operation on the chip select signal and the external self refresh control signal to generate an internal auto refresh control signal;
    an inverter configured to invert the external self refresh control signal;
    a second logical gate configured to perform a logical operation on the chip select signal and an output signal of the inverter to generate an internal self refresh control signal;
    a refresh oscillator configured to generate an oscillation signal based on the internal self refresh control signal; and
    a refresh counter configured to generate the internal refresh control signal based on the internal auto refresh control signal and the oscillation signal, and configured to count a number of refresh cycles, each refresh cycle corresponding to refresh operation of a row of the memory cell array.

3. The semiconductor memory device of claim 1, wherein the refresh control circuit comprises:
    a first logical gate configured to perform a logical operation on the chip select signal and the external self refresh control signal to generate an internal auto refresh control signal;
    a first inverter configured to invert the external self refresh control signal;
    a second logical gate configured to perform a logical operation on the chip select signal and an output signal of the first inverter to generate an internal self refresh control signal;
    a temperature compensation circuit configured to generate a period control signal according to variations of an operational temperature;
    a refresh oscillator configured to generate an oscillation signal based on the internal self refresh control signal and the period control signal; and
    a refresh counter configured to generate the internal refresh control signal based on the internal auto refresh control signal and the oscillation signal, and configured to count a number of refresh cycles, each refresh cycle corresponding to refresh operation of each row of the memory cell array.

4. A semiconductor memory device, comprising:
    a refresh control circuit configured to generate an internal refresh control signal based on a chip select signal and an external self refresh control signal; and
    a memory cell array configured to be refreshed based on the internal refresh control signal,
    wherein the refresh control circuit is configured to generate an internal self refresh control signal when the chip select signal is disabled and the external self refresh control signal is enabled.

5. The semiconductor memory device of claim 4, wherein the refresh control circuit comprises:
    a first logical gate configured to performs a logical operation on the chip select signal and the external self refresh control signal to generate an internal auto refresh control signal;
    an inverter configured to invert the external self refresh control signal;
    a second logical gate configured to perform a logical operation on the chip select signal and an output signal of the inverter to generate an internal self refresh control signal;
    a refresh oscillator configured to generate an oscillation signal based on the internal self refresh control signal; and
    a refresh counter configured to generate the internal refresh control signal based on the internal auto refresh control signal and the oscillation signal, and configured to count a number of refresh cycles, each refresh cycle corresponding to refresh operation of a row of the memory cell array.

6. The semiconductor memory device of claim 4, wherein the refresh control circuit comprises:
    a first logical gate configured to perform a logical operation on the chip select signal and the external self refresh control signal to generate an internal auto refresh control signal;
    a first inverter configured to invert the external self refresh control signal;
    a second logical gate configured to perform a logical operation on the chip select signal and an output signal of the first inverter to generate an internal self refresh control signal;
    a temperature compensation circuit configured to generate a period control signal according to variations of an operational temperature;
    a refresh oscillator configured to generate an oscillation signal based on the internal self refresh control signal and the period control signal; and
    a refresh counter configured to generate the internal refresh control signal based on the internal auto refresh control signal and the oscillation signal, and configured to count a number of refresh cycles, each refresh cycle corresponding to refresh operation of each row of the memory cell array.

7. A refresh control circuit, comprising:
    a first logical gate configured to perforin a logical operation on a chip select signal and an external self refresh control signal to generate an internal auto refresh control signal;
    a first inverter configured to invert the external self refresh control signal;
    a second logical gate configured to perform a logical operation on the chip select signal and an output signal of the first inverter to generate an internal self refresh control signal;
    a refresh oscillator configured to generate an oscillation signal based on the internal self refresh control signal; and
    a refresh counter configured to generate the internal refresh control signal based on the internal auto refresh signal and the oscillation signal, and configured to count a number of refresh cycles, each refresh cycle corresponding to refresh operation of a row of a memory cell array.

8. The refresh control circuit of claim 7, further comprising a temperature compensation circuit configured to generate a period control signal varying according to an operational temperature, and configured to provide the period control signal to the refresh oscillator to control a period of the oscillation signal.

9. The refresh control circuit of claim 8, wherein the temperature compensation circuit comprises:
a temperature sensor circuit configured to sense the operational temperature of a semiconductor memory device;
a comparison circuit configured to respectively compare a plurality of reference voltages and output signals of the temperature sensor circuit to generate comparison output signals;
a second inverter configured to invert the external self refresh control signal; and
a gating circuit configured to perform logical operations on an output signal of the second inverter and the comparison output signals to generate the period control signals.

10. The refresh control circuit of claim 9, wherein the temperature compensation circuit further comprises a reference voltage generation circuit configured to generate the plurality of reference voltages.

11. A memory system, comprising:
a memory controller configured to generate a chip select signal and an external self refresh control signal; and
a semiconductor memory device configured to generate an internal auto refresh control signal based on the chip select signal and the external self refresh control signal, and configured to' refresh a memory cell array based on the internal auto refresh control signal,
wherein the semiconductor memory device is configured to generate the internal auto refresh control signal when the chip select signal and the external self refresh control signal are disabled.

* * * * *